(12) United States Patent
Lee et al.

(10) Patent No.: US 9,030,890 B2
(45) Date of Patent: May 12, 2015

(54) SEMICONDUCTOR MEMORY APPARATUS (71) Applicant: SK Hynix Inc., Icheon-si Gyeonggi-do (KR)

(72) Inventors: Doo Chan Lee, Icheon-si (KR); Jong Yeol Yang, Icheon-si (KR)

(73) Assignee: SK Hynix Inc., Gyeonggi-do (KR)

( * ) Notice: Subject to any disclaimer, the term of this patent is extended or adjusted under 35 U.S.C. 154(b) by 145 days.

(21) Appl. No.: 13/845,317

(22) Filed: Mar. 18, 2013

(65) Prior Publication Data
US 2014/0003165 A1  Jan. 2, 2014

(30) Foreign Application Priority Data

Jun. 28, 2012 (KR) .................. 10-2012-0069551

(51) Int. Cl.
| G11C 5/14 | (2006.01) |
| G11C 7/08 | (2006.01) |
| G11C 7/20 | (2006.01) |
| G11C 7/12 | (2006.01) |

(52) U.S. Cl.
CPC .. G11C 7/08 (2013.01); G11C 7/12 (2013.01); G11C 7/20 (2013.01)

(58) Field of Classification Search
CPC ............... G11C 2211/4065; G11C 29/025; G11C 29/12005; G11C 29/1201; G11C 7/06; G11C 7/062; G11C 7/12
USPC ............ 365/207, 205, 203, 191, 196, 202, 365/185.17, 230.06
See application file for complete search history.

(56) References Cited

U.S. PATENT DOCUMENTS

2010/0067317 A1* 3/2010 Jung et al. .................. 365/207

FOREIGN PATENT DOCUMENTS

| KR | 1020030000843 A | 1/2003 |
| KR | 1020070036627 A | 4/2007 |

* cited by examiner

*Primary Examiner* — Thong Q Le
(74) *Attorney, Agent, or Firm* — William Park & Associates Ltd.

(57) ABSTRACT

A semiconductor memory apparatus includes a sense amplifier driving control unit configured to be applied with first and second driving voltages, and generate first to third sense amplifier driving signals in response to a mat enable signal, a sense amplifier enable signal and a power-up signal; a sense amplifier driving unit configured to, in response to the first to third sense amplifier driving signals, connect first and second sense amplifier driving nodes to cause the first and second sense amplifier driving nodes to have substantially the same voltage level, or disconnect the first and second sense amplifier driving nodes to apply first and second sense amplifier driving voltages to the first and second sense amplifier driving nodes; and a sense amplifier configured to be applied with the first and second sense amplifier driving voltages, and sense and amplify a voltage difference of a bit line and a bit line bar.

14 Claims, 4 Drawing Sheets

SEMICONDUCTOR MEMORY APPARATUS

CROSS-REFERENCES TO RELATED APPLICATION

The present application claims priority under 35 U.S.C. §119(a) to Korean application number 10-2012-0069551, filed on Jun. 28, 2012, in the Korean Intellectual Property Office, which is incorporated herein by reference in its entirety.

BACKGROUND

1. Technical Field

Various embodiments relate to a semiconductor integrated circuit, and more particularly, to a semiconductor memory apparatus.

2. Related Art

In general, a semiconductor memory apparatus is configured to store data and output the stored data. The semiconductor memory apparatus includes a memory cell which stores data, a bit line which transfers the voltage stored in the memory cell to a sense amplifier, and the sense amplifier which senses and amplifies the voltage applied from the bit line.

Figure 1:
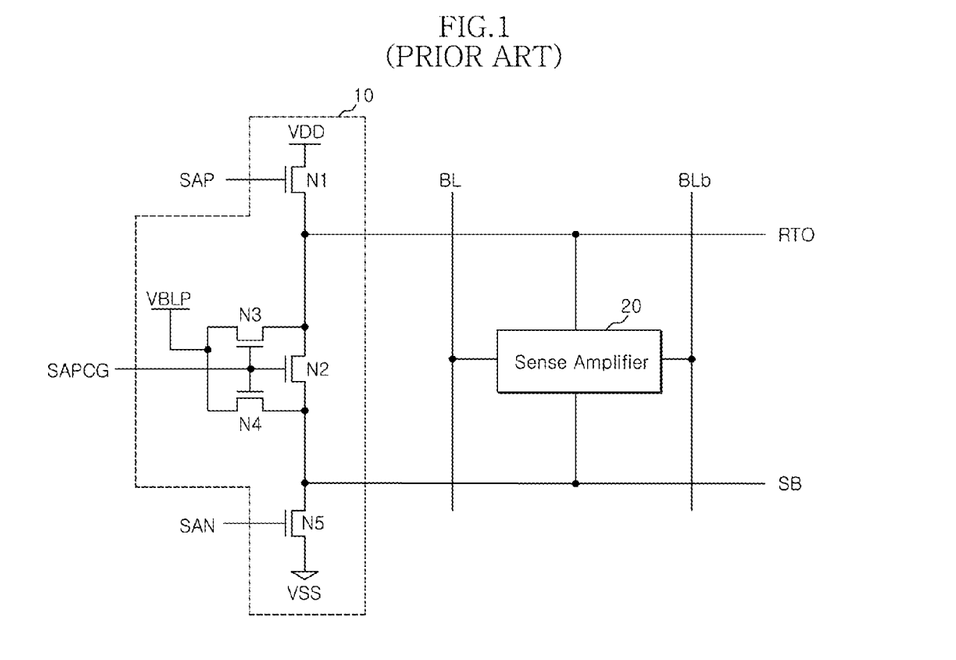
FIG. 1 is a configuration diagram of a conventional semiconductor memory apparatus.

Referring to FIG. 1, a conventional semiconductor memory apparatus includes a sense amplifier driving unit 10 and a sense amplifier 20.

The sense amplifier driving unit 10 applies first and second sense amplifier driving voltages VDD and VSS to first and second sense amplifier driving nodes RTO and SB, respectively, in response to first to third sense amplifier driving signals SAP, SAN and SAPCG. For example, the sense amplifier driving unit 10 applies the first sense amplifier driving voltage VDD to the first sense amplifier driving node RTO when the first sense amplifier driving signal SAP is enabled with the third sense amplifier driving signal SAPCG disabled. Also, the sense amplifier driving unit 10 applies the second sense amplifier driving voltage VSS to the second sense amplifier driving node SB when the second sense amplifier driving signal SAN is enabled with the third sense amplifier driving signal SAPCG disabled. When the third sense amplifier driving signal SAPCG is enabled, the sense amplifier driving unit 10 couples the first and second sense amplifier driving nodes RTO and SB and applies a bit line precharge voltage VBLP to the coupled nodes RTO and SB.

The sense amplifier driving unit 10 includes first to fifth transistors N1 to N5. The first transistor N1 has a gate which receives the first sense amplifier driving signal SAP, a drain which is applied with an external voltage VDD, and a source to which the first sense amplifier driving node RTO is coupled. In the case where the first transistor N1 is turned on by the first sense amplifier driving signal SAP, the external voltage VDD is outputted as the first sense amplifier driving voltage VDD to the first sense amplifier driving node RTO. The second transistor N2 has a gate which receives the third sense amplifier driving signal SAPCG, a drain to which the first sense amplifier driving node RTO is coupled, and a source to which the second sense amplifier driving node SB is coupled. The third transistor N3 has a gate which receives the third sense amplifier driving signal SAPCG, a drain which is applied with the bit line precharge voltage VBLP, and a source to which the first sense amplifier driving node RTO is coupled. The fourth transistor N4 has a gate which receives the third sense amplifier driving signal SAPCG, a drain which is applied with the bit line precharge voltage VBLP, and a source to which the second sense amplifier driving node SB is coupled. The drains of the third transistor N3 and the fourth transistor N4 are commonly coupled to each other, and a node to which the drains of the third transistor N3 and the fourth transistor N4 are commonly coupled is applied with the bit line precharge voltage VBLP. The fifth transistor N5 has a gate which receives the second sense amplifier driving signal SAN, a drain to which the second sense amplifier driving node SB is coupled, and a source which is applied with a ground voltage VSS. When the second sense amplifier driving signal SAN is enabled, the fifth transistor N5 outputs the ground voltage VSS as the second sense amplifier driving voltage VSS to the second sense amplifier driving node SB.

The sense amplifier 20 senses and amplifies the voltage level difference of a bit line BL and a bit line bar BLb when the first and second sense amplifier driving voltages VDD and VSS are applied to the first and second sense amplifier driving nodes RTO and SB.

In the semiconductor memory apparatus configured as mentioned above, in the case where the external voltage VDD is initially applied to the semiconductor memory apparatus, a case is likely to occur in which the voltage levels of the first to third sense amplifier driving signals SAP, SAN and SAPCG are not initialized. If all of the first to third sense amplifier driving signals SAP, SAN and SAPCG are not initialized, all of the first transistor N1, the second transistor N2 and the fifth transistor N5 may be turned on. Consequently, as current paths are formed through the first and second transistors N1 and N2 and the fifth transistor N5 turned on in this way, current may be unexpectedly consumed.

SUMMARY

A semiconductor memory apparatus which can prevent a current path from being formed in a sense amplifier driving unit when an external voltage is initially applied to the semiconductor memory apparatus is described herein.

In an embodiment, a semiconductor memory apparatus includes: a sense amplifier driving control unit configured to be applied with a first driving voltage and a second driving voltage which have different voltage levels, and generate a first sense amplifier driving signal, a second sense amplifier driving signal and a third sense amplifier driving signal in response to a mat enable signal, a sense amplifier enable signal and a power-up signal; a sense amplifier driving unit configured to, in response to the first to third sense amplifier driving signals, connect a first sense amplifier driving node and a second sense amplifier driving node to cause the first and second sense amplifier driving nodes to have substantially the same voltage level, or disconnect the first sense amplifier driving node and the second sense amplifier driving node to apply a first sense amplifier driving voltage to the first sense amplifier driving node and apply a second sense amplifier driving voltage to the second sense amplifier driving node; and a sense amplifier configured to be applied with the first and second sense amplifier driving voltages from the first and second sense amplifier driving nodes, and sense and amplify a voltage difference of a bit line and a bit line bar.

In an embodiment, a semiconductor memory apparatus includes: a sense amplifier driving control unit configured to generate first to third sense amplifier driving signals in response to a mat enable signal and a sense amplifier enable signal, and disable the first sense amplifier driving signal and the second sense amplifier driving signal and enable the third sense amplifier driving signal in response to a power-up signal; a sense amplifier driving unit configured to prevent a first sense amplifier driving voltage from being applied to a first sense amplifier driving node and prevent a second sense amplifier driving voltage from being applied to a second sense amplifier driving node when the first and second sense amplifier driving signals are disabled, and apply the first sense amplifier driving voltage to the first sense amplifier driving node and apply the second sense amplifier driving voltage to the second sense amplifier driving node when the first and second sense amplifier driving signals are enabled; and a sense amplifier configured to be applied with the first and second sense amplifier driving voltages from the first and second sense amplifier driving nodes, and perform a data sensing operation.

BRIEF DESCRIPTION OF THE DRAWINGS

Features, aspects, and embodiments are described in conjunction with the attached drawings, in which.

DETAILED DESCRIPTION

Hereinafter, a semiconductor memory apparatus according to the various embodiments will be described below with reference to the accompanying drawings through the embodiments.

Figure 2:
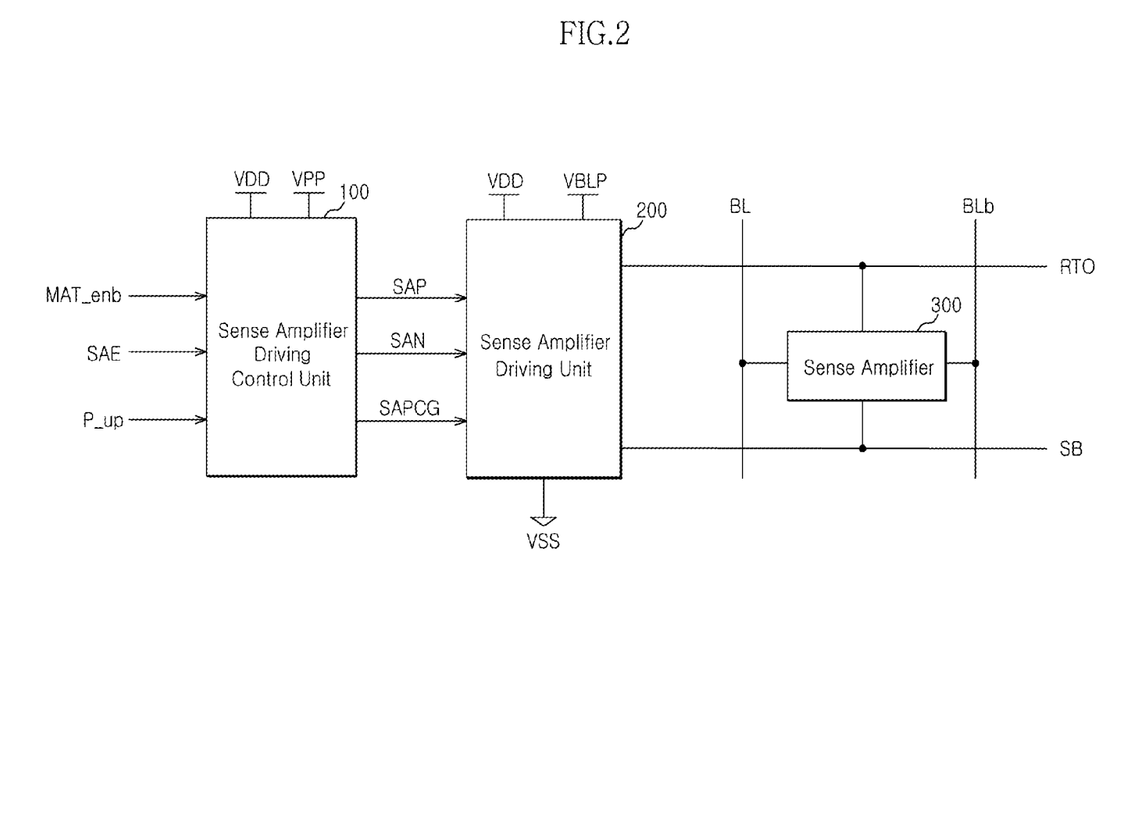
FIG. 2 is a configuration diagram of a semiconductor memory apparatus in accordance with an embodiment.

Referring to FIG. 2, a semiconductor memory apparatus in accordance with an embodiment may include a sense amplifier driving control unit 100, a sense amplifier driving unit 200, and a sense amplifier 300.

The sense amplifier driving control unit 100 may be configured to generate first to third sense amplifier driving signals SAP, SAN and SAPCG in response to a mat enable signal MAT_enb, a sense amplifier enable signal SAE and a power-up signal P_up. For example, the sense amplifier driving control unit 100 disables the first and second sense amplifier driving signals SAP and SAN and enables the third sense amplifier driving signal SAPCG when the power-up signal P_up is enabled. After the power-up signal P_up is disabled, the sense amplifier driving control unit 100 may generate the first to third sense amplifier driving signals SAP, SAN and SAPCG in response to the mat enable signal MAT_enb and the sense amplifier enable signal SAE. The sense amplifier driving control unit 100 may enable the first and second sense amplifier driving signals SAP and SAN and disable the third sense amplifier driving signal SAPCG when the mat enable signal MAT_enb and the sense amplifier enable signal SAE are enabled after the power-up signal P_up is disabled. The sense amplifier driving control unit 100 may disable the first and second sense amplifier driving signals SAP and SAN and enable the third sense amplifier driving signal SAPCG when even one of the mat enable signal MAT_enb and the sense amplifier enable signal SAE is disabled. The sense amplifier driving control unit 100 may be applied with an external voltage VDD as a first driving voltage and is applied with a pumping voltage VPP as a second driving voltage.

The sense amplifier driving unit 200 may be configured to connect first and second sense amplifier driving nodes RTO and SB in response to the first to third sense amplifier driving signals SAP, SAN and SAPCG such that the same voltage level, that is, the level of a bit line precharge voltage VBLP, is applied to the first and second sense amplifier driving nodes RTO and SB, or disconnect the first and second sense amplifier driving nodes RTO and SB in response to the first to third sense amplifier driving signals SAP, SAN and SAPCG such that a first sense amplifier driving voltage VDD is applied to the first sense amplifier driving node RTO and a second sense amplifier driving voltage VSS is applied to the second sense amplifier driving node SB. For example, when the first and second sense amplifier driving signals SAP and SAN are disabled, the sense amplifier driving unit 200 prevents the first sense amplifier driving voltage VDD from being applied to the first sense amplifier driving node RTO and prevents the second sense amplifier driving voltage VSS from being applied to the second sense amplifier driving node SB. If the third sense amplifier driving signal SAPCG is disabled, the sense amplifier driving unit 200 disconnects the first and second sense amplifier driving nodes RTO and SB.

When the first and second sense amplifier driving signals SAP and SAN are enabled, the sense amplifier driving unit 200 applies the first sense amplifier driving voltage VDD to the first sense amplifier driving node RTO and applies the second sense amplifier driving voltage VSS to the second sense amplifier driving node SB.

The sense amplifier 300 may be configured to sense and amplify the voltage difference of a bit line BL and a bit line bar BLb when being applied with the first and second sense amplifier driving voltages VDD and VSS from the first and second sense amplifier driving nodes RTO and SB. That is to say, the sense amplifier 300 may perform a data sensing operation when being applied with the first and second sense amplifier driving voltages VDD and VSS from the first and second sense amplifier driving nodes RTO and SB.

Figure 3:
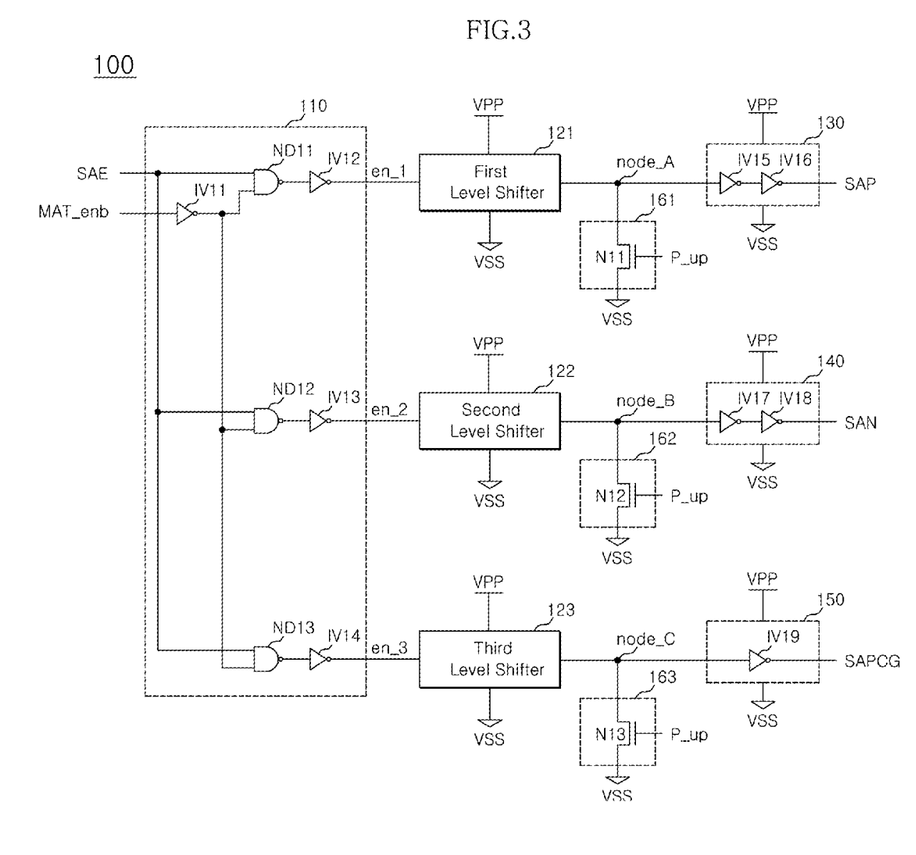
FIG. 3 is a configuration diagram of the sense amplifier driving control unit of FIG. 2.

Referring to FIG. 3, the sense amplifier driving control unit 100 may include an enable signal generating section 110, first to third level shifters 121, 122 and 123, first to third drivers 130, 140 and 150, and first to third initializing sections 161, 162 and 163.

The enable signal generating section 110 may be configured to enable first to third enable signals en_1, en_2 and en_3 when the mat enable signal MAT_enb and the sense amplifier enable signal SAE are enabled. Also, the enable signal generating section 110 may be configured to disable the first to third enable signals en_1, en_2 and en_3 when even one of the mat enable signal MAT_enb and the sense amplifier enable signal SAE is disabled.

The enable signal generating section 110 may include first to third NAND gates ND11, ND12 and ND13, and first to fourth inverters IV11 to IV14. The first inverter IV11 may receive the mat enable signal MAT_enb. The first NAND gate ND11 may receive the sense amplifier enable signal SAE and the output signal of the first inverter IV11. The second inverter IV12 may receive the output signal of the first NAND gate ND11 and may output the first enable signal en_1. The second NAND gate ND12 may receive the sense amplifier enable signal SAE and the output signal of the first inverter IV11. The third inverter IV13 may receive the output signal of the second NAND gate ND12 and may output the second enable signal en_2. The third NAND gate ND13 may receive the sense amplifier enable signal SAE and the output signal of the first inverter IV11. The fourth inverter IV14 may receive the output signal of the third NAND gate ND13 and may output the third enable signal en_3. The first to third NAND gates ND11, ND12 and ND13 and the first to fourth inverters IV11 to IV14 operate by receiving the external voltage VDD and a ground voltage VSS as driving voltages (not illustrated). Therefore, the first to third enable signals en_1, en_2 and en_3 are signals which swing to the external voltage VDD and the ground voltage VSS. The first to third NAND gates ND11, ND12 and ND13 and the first to fourth inverters IV11 to IV14 are component elements which operate by being applied with the external voltage VDD as a driving voltage (not illustrated).

The first level shifter 121 may generate the first enable signal en_1 which swings to the level of the external voltage VDD and the level of the ground voltage VSS, as a signal which swings to the level of the pumping voltage VPP and the level of the ground voltage VSS. In other words, the first level shifter 121 may apply the pumping voltage VPP or the ground voltage VSS to a first node node_A in response to the first enable signal en_1. For example, the first level shifter 121 applies the pumping voltage VPP to the first node node_A when the first enable signal en_1 is enabled to the level of the external voltage VDD, and may apply the ground voltage VSS to the first node node_A when the first enable signal en_1 is disabled to the level of the ground voltage VSS. The pumping voltage VPP may be a voltage which is generated inside the semiconductor memory apparatus or a voltage which is higher than the external voltage VDD applied from an outside of the semiconductor memory apparatus.

The second level shifter 122 may generate the second enable signal en_2 which swings to the level of the external voltage VDD and the level of the ground voltage VSS, as a signal which swings to the level of the pumping voltage VPP and the level of the ground voltage VSS. In other words, the second level shifter 122 may apply the pumping voltage VPP or the ground voltage VSS to a second node node_B in response to the second enable signal en_2. For example, the second level shifter 122 may apply the pumping voltage VPP to the second node node_B when the second enable signal en_2 is enabled to the level of the external voltage VDD, and may apply the ground voltage VSS to the second node node_B when the second enable signal en_2 is disabled to the level of the ground voltage VSS.

The third level shifter 123 may generate the third enable signal en_3 which swings to the level of the external voltage VDD and the level of the ground voltage VSS, as a signal which swings to the level of the pumping voltage VPP and the level of the ground voltage VSS. In other words, the third level shifter 123 may apply the pumping voltage VPP or the ground voltage VSS to a third node node_C in response to the third enable signal en_3. For example, the third level shifter 123 may apply the pumping voltage VPP to the third node node_C when the third enable signal en_3 is enabled to the level of the external voltage VDD, and may apply the ground voltage VSS to the third node node_C when the third enable signal en_3 is disabled to the level of the ground voltage VSS.

The first driver 130 may be applied with the pumping voltage VPP and the ground voltage VSS as driving voltages. The first driver 130 may drive the voltage level of the first node node_A and output the first sense amplifier driving signal SAP. The first driver 130 is a non-inverting driver.

The first driver 130 may include fifth and sixth inverters IV15 and IV16. The fifth inverter IV15 has an input terminal to which the first node node_A is coupled. The sixth inverter IV16 receives the output signal of the fifth inverter IV15 and outputs the first sense amplifier driving signal SAP. The fifth and sixth inverters IV15 and IV16 are applied with the pumping voltage VPP and the ground voltage VSS as driving voltages.

The second driver 140 may be applied with the pumping voltage VPP and the ground voltage VSS as driving voltages. The second driver 140 may drive the voltage level of the second node node_B and output the second sense amplifier driving signal SAN.

The second driver 140 is a non-inverting driver. The second driver 140 may include seventh and eighth inverters IV17 and IV18. The seventh inverter IV17 has an input terminal to which the second node node_B is coupled. The eighth inverter IV18 receives the output signal of the seventh inverter IV17 and outputs the second sense amplifier driving signal SAN. The seventh and eighth inverters IV17 and IV18 are applied with the pumping voltage VPP and the ground voltage VSS as driving voltages.

The third driver 150 may be applied with the pumping voltage VPP and the ground voltage VSS as driving voltages. The third driver 150 may drive the voltage level of the third node node_C and output the third sense amplifier driving signal SAPCG. The third driver 150 is an inverting driver.

The third driver 150 may include a ninth inverter IV19. The ninth inverter IV19 has an input terminal to which the third node node_C is coupled, and outputs the third sense amplifier driving signal SAPCG. The ninth inverter IV19 is applied with the pumping voltage VPP and the ground voltage VSS as driving voltages. As a consequence, the output signals of the first to third drivers 130, 140 and 150, that is, the first to third sense amplifier driving signals SAP, SAN and SAPCG are signals which swing to the levels of the pumping voltage VPP and the ground voltage VSS. Further, since the first and second drivers 130 and 140 are non-inverting drivers and the third driver 150 is an inverting driver, when all of the first to third enable signals en_1, en_2 and en_3 are enabled, the first and second sense amplifier driving signals SAP and SAN are substantially simultaneously enabled or disabled, and the third sense amplifier driving signal SAPCG has a phase opposite to those of the first and second sense amplifier driving signals SAP and SAN.

The first initializing section 161 may be configured to transition the first node node_A to a specified level in response to the power-up signal P_up. For example, the first initializing section 161 transitions the first node node_A to the level of the ground voltage VSS when the power-up signal P_up is enabled.

The first initializing section 161 may include a first transistor N11. The first transistor N11 has a gate which receives the power-up signal P_up, a drain to which the first node node_A is coupled, and a source which is applied with the ground voltage VSS.

The second initializing section 162 may be configured to transition the second node node_B to a specified level in response to the power-up signal P_up. For example, the second initializing section 162 transitions the second node node_B to the level of the ground voltage VSS when the power-up signal P_up is enabled.

The second initializing section 162 may include a second transistor N12. The second transistor N12 has a gate which receives the power-up signal P_up, a drain to which the second node node_B is coupled, and a source which is applied with the ground voltage VSS.

The third initializing section 163 may be configured to transition the third node node_C to a specified level in response to the power-up signal P_up. For example, the third initializing section 163 transitions the third node node_C to the level of the ground voltage VSS when the power-up signal P_up is enabled.

The third initializing section 163 may include a third transistor N13. The third transistor N13 has a gate which receives the power-up signal P_up, a drain to which the third node node_C is coupled, and a source which is applied with the ground voltage VSS.

The power-up signal P_up is a signal of which voltage level rises to be the same as the level of the external voltage VDD, that is, to be enabled, when the external voltage VDD is initially applied to the semiconductor memory apparatus, and falls to be the same as the level of the ground voltage VSS, that is, to be disabled, when the external voltage VDD becomes higher than a predetermined voltage level.

Figure 4:
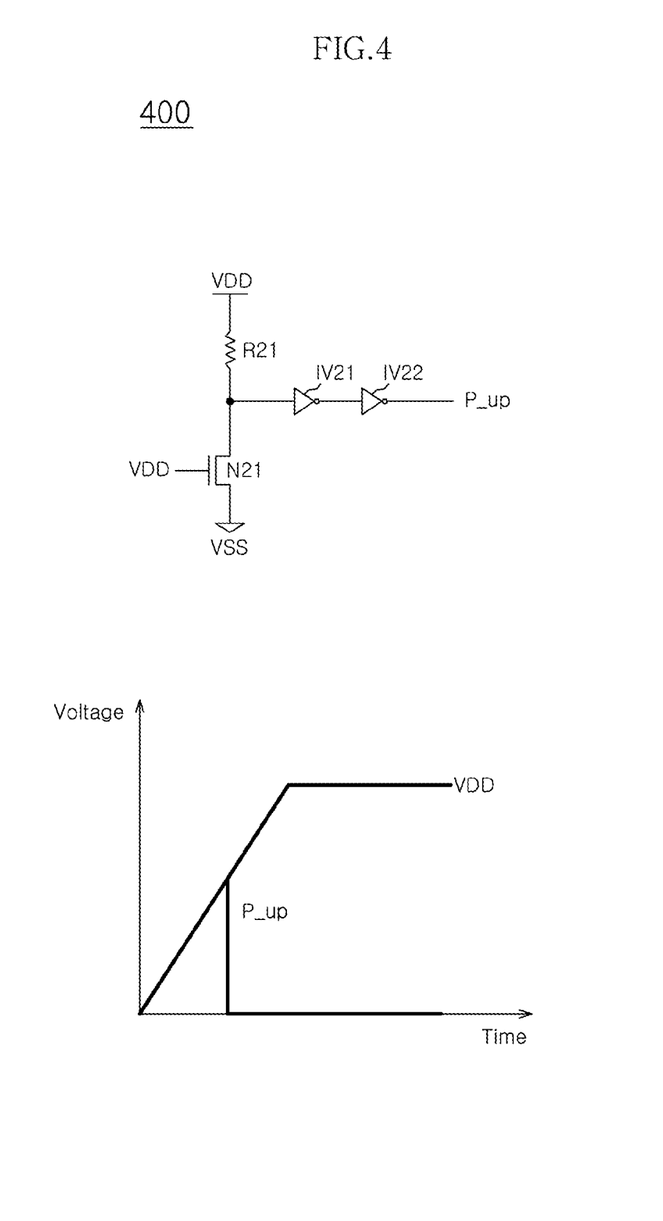
FIG. 4 is of a configuration diagram and a timing diagram of a power-up signal circuit.

The power-up signal P_up may be generated by a power-up signal generation unit 400 shown in FIG. 4. The power-up signal generation unit 400 may include a resistor R21, a transistor N21, and tenth and eleventh inverters IV21 and IV22. The resistor R21 has one end to which the external voltage VDD is applied. The transistor N21 has a gate which is applied with the external voltage VDD, a drain to which the other end of the resistor R21 is coupled, and a source which is applied with the ground voltage VSS. The tenth inverter IV21 has an input terminal to which a node coupled to the resistor R21 and the transistor N21 is coupled. The eleventh inverter IV22 receives the output signal of the tenth inverter IV21 and outputs the power-up signal P_up.

As shown in the timing diagram of FIG. 4, the voltage level of the power-up signal P_up rises in the same manner as the external voltage VDD when the external voltage VDD is initially applied to the semiconductor memory apparatus, and transitions to the level of the ground voltage VSS when the external voltage VDD becomes higher than the predetermined voltage level.

Operations of the semiconductor memory apparatus in accordance with the embodiments, configured as mentioned above, will be described below.

If the external voltage VDD is initially applied to the semiconductor memory apparatus, the level of the power-up signal P_up rises in the same manner as the level of the external voltage VDD. When the level of the external voltage VDD becomes higher than the predetermined voltage level, the power-up signal P_up transitions to the level of the ground voltage VSS. Namely, the power-up signal P_up is enabled in the same manner as the external voltage VDD, and is disabled when the level of the external voltage VDD becomes higher than the predetermined voltage level.

While the power-up signal P_up is enabled, all of the first to third nodes node_A, node_B and node_C shown in FIG. 2 become the ground voltage VSS, and accordingly, the first and second sense amplifier driving signals SAP and SAN are disabled and the third sense amplifier driving signal SAPCG is enabled.

If the first and second sense amplifier driving signals SAP and SAN are disabled, the sense amplifier driving unit 200 interrupts the application of the external voltage VDD to the first sense amplifier driving node RTO and the application of the ground voltage VSS to the second sense amplifier driving node SB. The first sense amplifier driving node RTO and the second sense amplifier driving node SB are coupled to each other, and the bit line precharge voltage VBLP is applied to a coupled node.

Thereafter, if the mat enable signal MAT_enb and the sense amplifier enable signal SAE are enabled, the enable signal generating section 110 enables all the first to third enable signals en_1, en_2 and en_3.

The enabled first to third enable signals en_1, en_2 and en_3 are respectively outputted as the first to third sense amplifier driving signals SAP, SAN and SAPCG through the first to third level shifters 121, 122 and 123 and the first to third drivers 130, 140 and 150. The first and second sense amplifier driving signals SAP and SAN are enabled to the level of the pumping voltage VPP, and the third sense amplifier driving signal SAPCG is disabled to the level of the ground voltage VSS.

According to the enabled first and second sense amplifier driving signals SAP and SAN, the first sense amplifier driving node RTO is applied with the external voltage VDD, and the second sense amplifier driving node SB is applied with the ground voltage VSS. Also, according to the disabled third sense amplifier driving signal SAPCG, the first and second sense amplifier driving nodes RTO and SB are discoupled.

Since the first and second sense amplifier driving nodes RTO and SB are discoupled and are respectively applied with the external voltage VDD and the ground voltage VSS, the sense amplifier 300 senses and amplifies the voltage level difference of the bit line BL and the bit line bar BLb.

If even one of the mat enable signal MAT_enb and the sense amplifier enable signal SAE is disabled, all the first to third enable signals en_1,en_2 and en_3 are disabled. The disabled first to third enable signals en_1,en_2 and en_3 are respectively outputted as the first to third sense amplifier driving signals SAP, SAN and SAPCG through the first to third level shifters 121, 122 and 123 and the first to third drivers 130, 140 and 150. The first and second sense amplifier driving signals SAP and SAN are disabled to the level of the ground voltage VSS, and the third sense amplifier driving signal SAPCG is enabled to the level of the pumping voltage VPP.

According to the enabled third sense amplifier driving signal SAPCG, the first and second sense amplifier driving nodes RTO and SB are coupled. The coupled first and second sense amplifier driving nodes RTO and SB are applied with the bit line precharge voltage VBLP.

Further, according to the disabled first and second sense amplifier driving signals SAP and SAN, the application of the external voltage VDD to the first sense amplifier driving node RTO is interrupted, and the application of the ground voltage VSS to the second sense amplifier driving node SB is interrupted.

The sense amplifier 300 is deactivated according to the first and second sense amplifier driving nodes RTO and SB which have the same voltage level being the level of the bit line precharge voltage VBLP. That is to say, the operation of the sense amplifier 300 for sensing and amplifying the voltage level difference between the bit line BL and the bit line bar BLb is interrupted.

In this way, the semiconductor memory apparatus in accordance with the embodiments apply the level of the pumping voltage VPP higher than the level of the external voltage VDD to transistors N1 to N5 of the sense amplifier driving unit 200 (configured in the same manner as in FIG. 1). As a consequence, voltage drop of the transistors N1 to N5 is prevented, and thus, the voltages VDD, VSS and VBLP applied through the transistors N1, N2 and N5 may be transferred to the first and second sense amplifier driving nodes RTO and SB without experiencing a voltage level drop. Moreover, because both the first and second sense amplifier driving signals SAP and SAN may be disabled in response to the power-up signal P_up, the transistors N1 and N5 may be turned off when the external voltage VDD is initially applied to the semiconductor memory apparatus, by which it is possible to prevent current paths from being formed through the transistors N1 to N5.

While various embodiments have been described above, it will be understood to those skilled in the art that the embodiments described are by way of example only. Accordingly, the semiconductor memory apparatus described herein should not be limited based on the described embodiments. Rather, the semiconductor memory apparatus described herein should only be limited in light of the claims that follow when taken in conjunction with the above description and accompanying drawings.

What is claimed is:

1. A semiconductor memory apparatus comprising:
a sense amplifier driving control unit configured to be applied with a first driving voltage and a second driving voltage which have different voltage levels, and generate a first sense amplifier driving signal, a second sense amplifier driving signal and a third sense amplifier driving signal in response to a mat enable signal, and a sense amplifier enable signal when a power-up signal is disabled;
a sense amplifier driving unit configured to, in response to the first to third sense amplifier driving signals, connect a first sense amplifier driving node and a second sense amplifier driving node to cause the first and second sense amplifier driving nodes to have substantially the same voltage level when the third sense amplifier driving signal is enabled, and disconnect the first sense amplifier driving node and the second sense amplifier driving node to apply a first sense amplifier driving voltage to the first sense amplifier driving node and apply a second sense amplifier driving voltage to the second sense amplifier driving node when the first and second sense amplifier driving signals are enabled and the third sense amplifier driving signal is disabled; and
a sense amplifier configured to be applied with the first and second sense amplifier driving voltages from the first and second sense amplifier driving nodes, and sense and amplify a voltage difference of a bit line and a bit line bar,
wherein the sense amplifier driving control unit disables the first and second sense amplifier driving signal and enables the third sense amplifier driving signal when the power-up signal is enabled.

2. The semiconductor memory apparatus according to claim 1, wherein the sense amplifier driving control unit comprises:
an enable signal generating section configured to enable all of a first enable signal, a second enable signal and a third enable signal when the mat enable signal and the sense amplifier enable signal are enabled;
a first level shifter configured to apply a pumping voltage to a first node when the first enable signal is enabled and apply a ground voltage to the first node when the first enable signal is disabled;
a second level shifter configured to apply the pumping voltage to a second node when the second enable signal is enabled and apply the ground voltage to the second node when the second enable signal is disabled;
a third level shifter configured to apply the pumping voltage to a third node when the third enable signal is enabled and apply the ground voltage to the third node when the third enable signal is disabled;
a first driver configured to drive a voltage level of the first node and output the first sense amplifier driving signal which swings to a level of the pumping voltage and a level of the ground voltage;
a second driver configured to drive a voltage level of the second node and output the second sense amplifier driving signal which swings to the level of the pumping voltage and the level of the ground voltage; and
a third driver configured to drive a voltage level of the third node and output the third sense amplifier driving signal which swings to the level of the pumping voltage and the level of the ground voltage.

3. The semiconductor memory apparatus according to claim 2, wherein the first and second sense amplifier driving signals are substantially simultaneously enabled or disabled, and the third sense amplifier driving signal has a phase opposite to phases of the first and second sense amplifier driving signals.

4. The semiconductor memory apparatus according to claim 3, wherein the first and second drivers are non-inverting drivers, and the third driver is an inverting driver.

5. The semiconductor memory apparatus according to claim 3, wherein the sense amplifier driving control unit further comprises:
initializing sections configured to disable both the first and second sense amplifier driving signals and enable the third sense amplifier driving signal in response to the power-up signal.

6. The semiconductor memory apparatus according to claim 5, wherein the initializing sections transition the first to third nodes to a specified level in response to the power-up signal.

7. The semiconductor memory apparatus according to claim 6, wherein the initializing sections transition the first to third nodes to the level of the ground voltage in response to the power-up signal.

8. The semiconductor memory apparatus according to claim 7, wherein the initializing sections comprise of first to third transistors, respectively, each having a gate for receiving the power-up signal, a source coupled to the ground voltage, and a drain coupled to the first to third nodes, respectively.

9. The semiconductor memory apparatus according to claim 1, further comprising:
a power-up signal generation unit configured for generating a power-up signal; and
wherein the power-up signal rises in substantially the same manner as an external voltage when the external voltage is initially applied to the semiconductor memory apparatus, and transitions to a voltage level of a ground voltage when the external voltage becomes higher than a predetermined voltage level.

10. The semiconductor memory apparatus according to claim 9, wherein the power-up signal generation unit comprises:
a resistor coupled to an external voltage, a first inverter coupled in series to a second inverter, and a drain of a transistor;
the transistor having a gate for receiving the external voltage and a source coupled to the ground voltage; and
the second inverter being configured for outputting the power-up signal.

11. The semiconductor memory apparatus according to claim 1,
wherein the sense amplifier driving unit disconnects the first and second sense amplifier driving nodes when the third sense amplifier driving signal is disabled, and connects the first and second sense amplifier driving nodes and applies a bit line precharge voltage to the coupled first and second sense amplifier driving nodes when the third sense amplifier driving signal is enabled, and
wherein the sense amplifier driving unit applies the first sense amplifier driving voltage to the first sense amplifier driving node and applies the second sense amplifier driving voltage to the second sense amplifier driving node when the first sense amplifier driving signal is enabled with the third sense amplifier driving signal disabled.

12. A semiconductor memory apparatus comprising:

a sense amplifier driving control unit configured to generate first to third sense amplifier driving signals in response to a mat enable signal and a sense amplifier enable signal when a power-up signal is disabled, and disable the first sense amplifier driving signal and the second sense amplifier driving signal and enable the third sense amplifier driving signal when the power-up signal is enabled;

a sense amplifier driving unit configured to prevent a first sense amplifier driving voltage from being applied to a first sense amplifier driving node and prevent a second sense amplifier driving voltage from being applied to a second sense amplifier driving node when the first and second sense amplifier driving signals are disabled, and apply the first sense amplifier driving voltage to the first sense amplifier driving node and apply the second sense amplifier driving voltage to the second sense amplifier driving node when the first and second sense amplifier driving signals are enabled; and a sense amplifier configured to be applied with the first and second sense amplifier driving voltages from the first and second sense amplifier driving nodes, and perform a data sensing operation.

13. The semiconductor memory apparatus according to claim 12, wherein the sense amplifier driving control unit comprises:

an initializing section configured to disable the first and second sense amplifier driving signals and enable the third sense amplifier driving signal in response to the power-up signal;

an enable signal generating section configured to generate first to third enable signals when the mat enable signal and the sense amplifier enable signal are enabled;

level shifters configured to level-shift the first to third enable signals; and drivers configured to drive output signals of the level shifters and output the first to third sense amplifier driving signals.

14. The semiconductor memory apparatus according to claim 12, wherein the sense amplifier driving unit comprises:

a sense amplifier driving node control section configured to disconnect the first and second sense amplifier driving nodes when the third sense amplifier driving signal is disabled, and connect the first and second sense amplifier driving nodes and apply a bit line precharge voltage to the coupled first and second sense amplifier driving nodes when the third sense amplifier driving signal is enabled;

a first voltage applying section configured to apply the first sense amplifier driving voltage to the first sense amplifier driving node when the first sense amplifier driving signal is enabled with the third sense amplifier driving signal disabled; and a second voltage applying section configured to apply the second sense amplifier driving voltage to the second sense amplifier driving node.

* * * * *